United States Patent [19]

Zellmer et al.

[11] Patent Number: 4,746,597

[45] Date of Patent: May 24, 1988

[54] IMAGE DELETION FLUID FOR PRINTING PLATE

[75] Inventors: Bruce A. Zellmer, Hudson, Wis.; David R. Boston, Woodbury, Minn.

[73] Assignee: Minnesota Mining and Manufacturing Co., St. Paul, Minn.

[21] Appl. No.: 921,759

[22] Filed: Oct. 22, 1986

[51] Int. Cl.$^4$ .................. G03C 11/04; G03C 5/00
[52] U.S. Cl. ................................ 430/331; 430/204; 430/205
[58] Field of Search .................. 430/331, 204, 205

[56] References Cited

U.S. PATENT DOCUMENTS 3,961,928  6/1976  DeLorenzo .................. 134/3
4,361,635  11/1982  Kinderman et al. ........ 430/14
4,443,531  4/1984  Yamada et al. ............. 430/204

Primary Examiner—Paul R. Michl
Assistant Examiner—Mark R. Buscher
Attorney, Agent, or Firm—Donald M. Sell; James A. Smith; Robert H. Jordan

[57] ABSTRACT

An image deletion fluid for printing plates which use a silver image as an ink-receptive area. The deletion fluid comprises iodine and an effective excess of iodide ion, which form a triiodide complex, and a hydrophilic-matrix-forming agent. In a preferred embodiment, the deletion fluid further comprises an organic, preferably polar, solvent. The deletion fluid is applied to the surface of the plate, rubbed briefly and allowed to dry there, with no removal or rinsing away of the deletion fluid or by-products required.

9 Claims, No Drawings

IMAGE DELETION FLUID FOR PRINTING PLATE

FIELD OF INVENTION

This invention relates to an image deletion fluid for a printing plate which uses silver as the ink-receptive image area.

BACKGROUND

One form of printing plates uses silver images as ink-receptive areas. When such plates are made, e.g., by photographic or mechanical processes, undesired images may be formed, e.g., by dust, fingerprints, stains; or images may be present in an original which are not wanted in all copies to be produced, e.g., serial numbers. In order to obtain good printed matter, undesired portions of the image must be deleted after the plate has been made. Preferably such deletion may be performed either before printing or after several copies have been made.

Many proposals have been made for deleting undesired images. For instance; one method comprises precipitating a hydrophilic metal salt, rubber, latex, or gelatin to produce a hydrophilic layer or "cap" over the undesired silver image. Such caps tend to be insufficiently durable and to wear away, especially during long press runs, causing the "deleted" image to reappear after a few hundred copies or impressions.

Other methods include mechanically removing the silver image by erasers, knives, etc. to expose the underlying hydrophilic plate base, or treating the undesired image with an oxidizing solution, e.g., a solution which contains an oxidant such as a bichromate or ferricyamide and a sulfite or thiosulfate, thereby rendering it hydrophilic.

U.S. Pat. No. 4,433,531 (Yamada et al.) discloses an aqueous deletion solution comprising an s-triazine compound. U.S Pat. No. 3,961,928 (DeLorenzo) discloses an aqueous deletion fluid comprising nitric acid and an inert metal oxide thickening agent. A problem with many oxidizing solutions is that they may achieve only partial deletion or typically require skilled application to achieve satisfactory results. Some silver bleaching agents require subsequent application of an additional formulation to "fix" the deletion. Further, many oxidizing solutions may leave oleophilic by-products. These by-products typically tend to accumulate around an area of deletion as halo-like diffusion rings which contain incompletely oxidized silver, or may be rendered oleophilic through absorption of ink components. Such halos are believed to be the result of migration of the solution through the plate base, outwardly from the point of application. As the solution emerges from within the plate base, it tends to raise or "leach-out" oleophilic silver from within the plate which attracts ink residue, etc. Such halos typically spoil copies produced during the start-up phase of printing, i.e., the first few hundred impressions, tending to wear away thereafter.

A commercial product available from the Minnesota Mining and Manufacturing Company, XL Image Deletion Fluid, contains an aqueous solution comprising a triiodide complex ($I_3^-$), which is formed from dissolved iodine and iodide ion, and fumed silica as a thickening agent. Deletion is accomplished by rubbing the solution on the undesired image areas, e.g., with a cotton swab, thereby oxidizing the silver image. This action produces relatively oleophilic residues which must then be removed, e.g., by wiping with a clean swab or rinsing the affected area with water. While effective deletion may be achieved with such solutions, residence time or duration of application is critical. Insufficient residence time may result in incomplete deletion whereas an excessive residence time may lead to the formation of the halo-like images discussed above.

SUMMARY OF INVENTION

This invention provides an image deletion fluid for deleting unwanted images from a printing plate which uses silver as the ink-receptive image area. Such unwanted images may consist of imaging errors, e.g., shadow lines or pepper, or portions of an original which are not wanted in some or all of the copies, e.g., serial numbers. The deletion fluid of the invention, which comprises a hereinafter defined oxidation agent and hydrophilic-matrix-forming agent, may be used on printing plates either before printing or after several copies have been made, and may be used with a variety of conventional inks, e.g., oil-based, rubber-based, ultraviolet-curing, etc.

Briefly summarizing, the novel deletion fluid is an acidic aqueous solution comprising: (1) iodine; (2) an effective excess of iodide ion, e.g., formed from hydriodic acid, sodium iodide, or potassium iodide; and (3) an effective amount of a hydrophilic-matrix-forming agent (hereinafter "HMFA"), such as colloidal silica or chitosan polymer. In a preferred embodiment, the deletion fluid further comprises an organic, preferably polar, solvent, e.g., methyl or isopropyl alcohol.

Deletion is easily achieved by simple application, e.g., with a cotton swab, of the deletion fluid to a printing plate, whereupon the area of the undesired image is rubbed briefly, thereby oxidizing the silver image. After the undesired image area is rubbed briefly, the deletion fluid is allowed to dry. As the water and organic solvent evaporate, the relatively oleophilic by-products formed by oxidation of the silver image are absorbed within a matrix formed by the HMFA. Deletion may be achieved quickly, i.e., typically in less than one minute, and does not require carefully timed subsequent removal, e.g., rinsing, of the deletion fluid or oleophilic residues from the plate surface. The novel deletion fluid of the invention may be used to delete images from newly formed printing plates, from printing plates which are mounted on a printing press, and from printing plates which have been previously used.

Unlike previously known deletion solutions, which tend to be slower acting, to result in incomplete deletion if removed prematurely, and to produce oleophilic diffusion rings or halos, especially if left on the plate too long, the deletion fluid of the present invention is faster acting, is substantially less time dependent, and does not result in diffusion rings.

DETAILED DESCRIPTION OF INVENTION

The present invention employs an acidic, i.e., having a pH below 7.0, preferably between about 4.0 and 6.5, aqueous solution comprising iodine, an effective excess of iodide ion, an effective amount of an HMFA, and, preferably, an organic solvent. Deletion is achieved by applying the solution, e.g., with a cotton swab, to an unwanted image area and rubbing briefly, e.g., 15 to 30 seconds, until the metallic sheen of the silver image has turned dark. A triiodide complex ($I_3^-$), formed by the iodine and iodide ion, oxidizes the contacted silver image. The deletion fluid is then allowed to dry on the plate, whereupon the HMFA forms a hydrophilic matrix entrapping the oleophilic oxidation by-products within. After the area has dried, typically within a minute or less after initial application of the deletion fluid, the printing plate is ready for use. No rinsing or further treatment is necessary to prepare or "fix" the deletion. Printing plates which have been treated with the deletion fluid provided herein start up clean and may be run for extended printing runs, e.g., several thousand copies or more, without reappearance of the deleted image.

Deletion may be performed on a newly formed printing plate or on a plate which has been previously used. In the latter instance, it will typically be desirable to rinse the region around the intended deletion area with fountain solution, a press cleaning agent, or water to remove any remaining ink or other matter which may interfere with or contaminate the deletion action. For instance, ink residues may contaminate the hydrophilic matrix over the deletion area, thereby tending to render it, at least in part, oleophilic. Also, effective cleaning of the affected area enables better visual inspection to ensure that the entire undesired image is deleted and that no unwanted deletion occurs outside the deletion area.

The deletion fluid of the invention generally comprises about 0.5 to about 5.0 weight percent of dissolved iodine, with levels of about 4.0 weight percent being preferred. Decreasing amounts of iodine may tend to reduce the effectiveness of oxidation of the silver image which is achieved, e.g., resulting in slower or incomplete deletion. Increasing concentrations of iodine are similarly not preferred, because the solution may tend to thicken undesirably or to even gel, thus interfering with convenience of application, and, possibly, with the desired deletion action.

The deletion fluid also comprises an "effective excess" of iodide ion, which may be provided in such forms as potassium iodide (KI), sodium iodide (NaI), or hydriodic acid (HI). By effective excess, it is meant iodide ion is present in at least stoichiometric excess, and preferably in about a 1.4:1 mole ratio, with iodide, to provide the desired formation of the triiodide complex. An effective excess of iodide ion will typically be provided at concentrations between about 0.5 and about 5.0 weight percent of hydriodic acid or between about 6.0 and about 18.0 weight percent of potassium iodide, depending upon the concentration of iodine. Decreasing amounts of iodide ion may tend to provide a reduced rate of silver oxidation, whereas increasing concentrations thereof may tend to cause the solution to gel.

The deletion fluid preferably also comprises at least one organic, preferably polar, solvent. The organic solvent increases the rate at which the aqueous deletion fluid evaporates from the printing plate after deletion of image, aids in control of the viscosity of the deletion fluid (thinning the same), and, to a lesser extent, aids in solubilizing the HMFA. Polar solvents are preferred because they tend to be more effective in solubilizing the HMFA. Examples of suitable solvents include methyl alcohol, ethyl alcohol, isopropyl alcohol, and n-propyl alcohol. The solution may contain up to about 90 weight percent of one or more organic solvents with about 25 to about 85 weight percent typically being preferred. The optimal proportion of organic solvent, which will depend upon the specific application according to the solubility and stability of the HMFA, desired rate of evaporation, desired viscosity of deletion fluid, etc., may be readily determined by experiment. Deletion fluids comprising lesser amounts of solvent may tend to dry more slowly. Substantially greater amounts of solvent may thin the deletion fluid excessively, causing it to bleed or run beyond intended application area, leading to messier use and possibly unwanted deletion, and may cause the deletion fluid to evaporate too quickly for convenient use. Also, such extreme amounts of solvent may interfere with solution of the iodide salt, reduce the deletion fluid's resistance to gelling, and lead to formation of halos.

The deletion fluid further comprises an effective amount of an HMFA or hydrophilic-matrix-forming agent. Examples thereof include acidic colloidal silica, which is preferred, and chitosan polymer, an amino-functional cellulose which is highly hydrophilic. As the triiodide complex oxidizes the silver image, the HMFA forms a matrix over the deleted image, entraining the oxidized silver therein. It is believed that the HMFA is able to penetrate into the plate base matrix and bond there, thereby reducing the tendency of the fluid to penetrate deeply or laterally within the plate base, thus preventing formation of halo-like diffusion rings which tend to occur around deleted images and reducing the tendency of the layer to wear away during printing. Further, an HMFA, such as colloidal silica or chitosan, tends to increase the viscosity of the deletion fluid, thereby slowing its penetration into the plate base matrix and inhibiting the potential leaching-out phenomenon described above.

Useful colloidal silicas typically have an average particle size in the range of about 5 to about 50 nanometers, with those having an average particle size of about 30 nanometers being most preferred. Examples of suitable acidic colloidal silicas include NALCO 1034-A, ISJ-612, and ISJ-614 which each have a pH of about 3.0 to about 4.5. Alkaline forms of colloidal silica, which have a pH between about 8.0 and 10.0, tend to cause the solution to gel. Amounts of colloidal silica between about 8.0 and 15.0 weight percent of the fluid are typically useful, with levels of about 12.0 weight percent thereof being preferred. Decreasing amounts of colloidal silica may not effectively prevent formation of the undesired halo-like diffusion rings whereas increasing amounts may tend to cause the solution to gel and to reduce its oxidizing power, thereby interfering with desired deletion.

Chitosan polymer is another useful HMFA. Useful amounts thereof typically range from about 0.5 to about 2.0 weight percent of the deletion fluid. Substantially greater amounts of chitosan may tend to cause the solution to dry more slowly after application and to sharply increase the viscosity of the solution, possibly rendering the deletion fluid difficult to work with. If chitosan is used, the deletion fluid preferably comprises iodide in an acidic form, e.g., hydriodic acid, greater amounts of organic solvent, and further comprises an effective amount of an organic acid, e.g., acetic acid, to aid in dissolving the chitosan. For instance, glacial acetic acid in an approximate equal weight percentage as the chitosan has been found to be an effective aid in dissolving the latter.

Colloidal silica is generally the preferred HMFA because deletion fluids comprising same are typically most resistant to formation of halo-like diffusion rings and have a greater shelf-life.

The deletion fluid typically comprises about 20 to about 40 weight percent of water, preferably about 35 weight percent thereof. Water serves to moderate the rate at which the deletion fluid evaporates from a printing plate after application and is an excellent solvent for iodide salts.

The deletion fluid is acidic, having a pH of below 7.0, and preferably between about 4.0 and about 6.5. Such ranges are desired to ensure stability of the solution, tend to prevent gelation, and aid in solubility of such hydrophilic-matrix-forming agents as chitosan. Further, most fountain solutions are acidic, therefore an acid deletion fluid is more compatible therewith.

The present invention will be further explained by the following illustrative examples which are intended to be nonlimiting. Unless otherwise indicated, all amounts are in parts by weight.

EXAMPLES 1-3

In a suitable container, 22.7 parts of potassium iodide powder were added to 22.7 parts distilled water, followed by 1.7 parts iodine powder, 37.8 parts isopropyl alcohol, and 15.1 parts NALCO 1034-A, a 34 weight percent solids solution of colloidal silica commercially available from Nalco Chemical Company, while stirring to produce the deletion fluid. The fluid was clear and brown in color.

The deletion fluid was tested on printing plates of the type disclosed in U.S. Pat. No. 4,361,635 (Kinderman et al.) which use a silver image as an ink-receptive area. After the plates were imaged, portions of the image on each plate were wiped with a swab soaked with the deletion fluid for a few seconds until the affected portion of the image turned from a metallic sheen appearance to dark color. The fluid was then allowed to dry in the plate, requiring 30 seconds or less to do so.

The plates were then run on a Hamada printing press with different inks to test the deletion achieved. In Example 3, 30 grams of pumice was mixed with 10 pounds of ink to increase the abrasiveness of the printing action to test the durability of the deleted area.

The deletion fluid achieved satisfactory deletion, providing a clean start up, and no formation of halo-like diffusion rings. Ten thousand impressions were made with the plates in Examples 1 and 3 and 20,000 impressions were made with the plate in Example 2 with no evidence that the "deleted" image was reappearing. The results are tabulated in Table 1.

EXAMPLES 4-6

Deletion fluids were made as in Example 1, except the amount of colloidal silica in each solution was reduced as indicated.

Each deletion fluid was tested as in Example 1 and the plate run with the indicated ink.

Complete deletion was achieved in each case except for Example 6 which contained no colloidal silica. The plates in both Example 4 and Example 5 showed no sign that the "deleted" image was reappearing after 10,000 impressions. The results are tabulated in Table 1.

TABLE 1

| Example | Silica (Parts) | Ink Type | Start Up | Halo |
|---|---|---|---|---|
| 1 | 15.1 | Rubber[1] | Clean | No |
| 2 | 15.1 | Oil[2] | Clean | No |
| 3 | 15.1 | Oil[3] | Clean | No |
| 4 | 7.5 | Rubber[4] | Clean | No |
| 5 | 3.7 | Rubber[4] | Clean | No |
| 6 | 0 | Rubber[4] | Ghost-Image Not Completely Deleted | |

[1]RUBBER BASE PLUS VanDijk Brown VS 355, available from VanSon Holland Ink Corporation of America.
[2]KWIKLITH GOLD TOP Black, available from Consolidated Printing Ink.
[3]KWIKLITH Black, available from Consolidated Printing Ink.
[4]RUBBER BASE PLUS Pantone Purple VS 305, available from VanSon Holland Ink Corporation of America.

EXAMPLES 7-11

A deletion fluid of the invention comprising chitosan polymer as the hydrophilic-matrix-forming agent was prepared as follows. Fifty grams of chitosan polymer, commercially available from Bioshell, Inc., was added to a container containing 1 liter of a 50 weight percent aqueous solution of sodium hydroxide, heated to 90° and continuously stirred for 24 hours to reduce the chain length of the polymer. The treated polymer was then filtered from the solution, rinsed five times with distilled water, and air dried.

Ten parts of the treated chitosan polymer was combined with 37 parts water, 37 parts methyl alcohol, and 16 parts of glacial acetic acid, and the mixture was then heated to 45° C. for three hours while continuously stirring to dissolve the chitosan. The mixture was then diluted with 500 parts of methanol while continuously stirring.

To 100 parts of the working mixture described above, 0.88 parts iodine powder, and 2.64 parts of 47 percent hydriodic acid were added while stirring vigorously. The composition was then heated to 50° C. and continuously stirred for two hours to effect complete solution. The deletion fluid produced above was clear and dark red in color.

The deletion fluid was tested as in Example 1 on printing plates with different inks to test the deletion achieved.

The deletion fluid achieved satisfactory deletion, providing a clean start up and no formation of halo-like diffusion rings. Even after 10,000 impressions were made, none of the "deleted" images showed evidence of reappearing. The results are tabulated in Table 2.

TABLE 2

| Example | HMFA | Ink Type | Start Up | Halo |
|---|---|---|---|---|
| 7 | Chitosan | Rubber[1] | Clean | No |
| 8 | Chitosan | Oil[2] | Clean | No |
| 9 | Chitosan | Rubber[4] | Clean | No |
| 10 | Chitosan | Oil[5] | Clean | No |
| 11 | Chitosan | Rubber[6] | Clean | No |

[1]RUBBER BASE PLUS VanDijk Brown VS 355.
[2]KWIKLITH GOLD TOP Black.
[3]RUBBER BASE PLUS Pantone Purple VS 305.
[4]OIL BASE PLUS 40904 Black, available from VanSon Holland Ink Corporation of America.
[6]RUBBER BASE PLUS 12630 Black VS 102, available from VanSon Holland Ink Corporation of America.

EXAMPLES 12-16

In Examples 12-15, test fluids were made as in Example 1, except the indicated water-soluble, film-forming polymer was substituted for colloidal silica. RETEN-TYPE 300 is a polyacrylamide polymer formerly available from Hercules Corporation. In Example 16, fumed silica was the test agent.

Each fluid was tested as in Example 1.

None of the fluids achieved satisfactory deletion as each plate tested started up with an image which remained visible at least after 250 impressions. None of the test agents formed a hydrophilic-matrix, each leaving a relatively oleophilic residue. The results are tabulated in Table 3.

TABLE 3

| Example | Test Agent | Ink Type | Start Up |
|---------|------------|----------|----------|
| 12 | Polyacrylic Acid | Oil[3] | Ghost |
| 13 | Polyvinyl Pyrrolidone | Oil[3] | Ghost |
| 14 | Polyvinyl Alcohol | Oil[3] | Ghost |
| 15 | RETEN-TYPE 300 | Oil[3] | Ghost |
| 16 | Fumed Silica | Oil[3] | Ghost |

[3]KWIKLITH GOLD TOP Black - with pumice added.

Various modifications and alterations of this invention will become apparent to those skilled in the art without departing from the scope and spirit of this invention.

What is claimed is:

1. A silver image deletion fluid comprising an acidic aqueous solution of:
   (a) iodine;
   (b) an effective excess of iodide ion; and
   (c) an effective amount of a hydrophilic-matrix-forming agent.

2. The deletion fluid of claim 1 which further comprises:
   (d) an organic solvent.

3. The deletion fluid of claim 2 wherein said organic solvent comprises at least one of the following: methyl alcohol, ethyl alcohol, isopropyl alcohol, or n-propyl alcohol.

4. The deletion fluid of claim 1 comprising:
   (a) between about 0.5 and about 5.0 weight percent of iodine;
   (b) an effective excess of iodide ion;
   (c) an effective amount of hydrophilic-matrix-forming agent; and
   (d) up to about 90 weight percent organic solvent.

5. The deletion fluid of claim 1 which further comprises acetic acid and wherein said hydrophilic-matrix-forming agent is chitosan polymer.

6. The deletion fluid of claim 5 which comprises:
   (a) between about 0.5 and about 5.0 weight percent of iodine;
   (b) an effective excess of hydriodic acid;
   (c) between about 0.5 and about 2.0 weight percent of chitosan;
   (d) up to about 90 weight percent of an organic solvent; and
   (e) an effective amount of acetic acid.

7. The deletion fluid of claim 1 wherein said hydrophilic-matrix-forming agent is colloidal silica.

8. The deletion fluid of claim 7 which comprises:
   (a) between about 0.5 and about 5.0 weight percent of iodine;
   (b) an effective excess of iodide ion formed from potassium iodide or sodium iodide;
   (c) between about 8.0 and about 15.0 weight percent of colloidal silica; and
   (d) up to about 90 weight of an organic solvent.

9. The deletion fluid of claim 8 which comprises:
   (a) about 4.0 weight percent of iodine;
   (b) an effective excess of potassium iodide;
   (c) about 10 weight percent of colloidal silica; and
   (d) about 40 weight percent of isopropyl alcohol.

* * * * *